United States Patent

Vassallo et al.

[11] Patent Number: 5,088,100
[45] Date of Patent: Feb. 11, 1992

[54] LASER DIODE OPTICAL AMPLIFIER

[75] Inventors: Charles Vassallo, Tregastel; Jean-Claude Simon, Perros Guirec, both of France

[73] Assignee: French State, represented by the Minister of Post, Telecommunications and Space, Issy les Moulineaux, France

[21] Appl. No.: 610,588

[22] Filed: Nov. 8, 1990

[30] Foreign Application Priority Data

Nov. 13, 1989 [FR] France .................. 89 14848

[51] Int. Cl.$^5$ ............................................. H01S 3/19
[52] U.S. Cl. ................................... 372/45; 372/46
[58] Field of Search ...................... 372/45, 46, 43

[56] References Cited

U.S. PATENT DOCUMENTS 4,506,366  3/1985  Chinone et al. ............... 372/46
4,546,480  10/1985  Burnham et al. ............ 372/45

Primary Examiner—Georgia Epps
Attorney, Agent, or Firm—Larson and Taylor

[57] ABSTRACT

A non-resonating laser diode optical amplifier comprises a strip of optically active material forming an amplifying optical guide, covered with a confinement sheath and defined by antireflection coating layers. The strip has end portions whose thickness is lesser than that of a central portion and is selected to give a low value to the difference between the wavelengths corresponding to the reflectivity minima for the two inherent polarization states. The end portions are connected to the central portion by transition sections having a progressively increasing thickness.

7 Claims, 2 Drawing Sheets

LASER DIODE OPTICAL AMPLIFIER

BACKGROUND OF THE INVENTION

The present invention relates to an optical non-resonating laser diode amplifier, comprising an active material strip forming an amplifying optical guide, covered with a confinement sheath and defined by anti-reflection coating layers.

The invention is particularly suitable for use in linear repeaters or receiving pre-amplifiers in transmission systems incorporating optical fibers which do not preserve light polarization. That situation is found in most present-day communication systems.

For obtaining a non-resonant laser diode optical amplifier, the reflectivities of its end faces should be reduced, with dielectric antireflection coatings, for giving a low value, typically less than 0.1 to:

$$G \sqrt{R1 \cdot R2} \quad (1)$$

where G is the internal gain of the laser diode and R1, R2 designate the residual reflectivities of the faces.

This condition would be well defined if a single value had to be taken into consideration for G, R1 and R2. It is unfortunately not fulfilled for:

due to its very structure, the laser diode amplifier has two inherent polarization states which correspond to different internal gains G: in a currently available laser diode operating at a wavelength of 1.5 μm, whose active material strip has a thickness d between 0.1 and 0.2 micron, a width between 1 and 2 microns and a length L of about 500 microns, the geometric dissymetry gives to the optical guide formed by the laser diode two inherent non-degenerated polarized states, having different propagation constants, consequently different confinement factors and a difference between the gains all the higher as the thickness d of the strip is smaller.

the residual modal reflectivity of the anti-reflection coatings depends on the polarization, for the reflectivity minima for two mutually orthogonal polarizations are situated at different wavelengths.

It can be seen that the overall gain of the amplifier has a sensitivity to the polarization of the signal with two separate origins.

It is known that the difference between internal gains corresponding to the TE and TM modes can be reduced by increasing the thickness d of the guide. But any thickness increase moves apart the wavelengths corresponding to the reflectivity minima for the TE and TM polarizations, so the difference between the modal reflectivities for the wavelength of the laser diode.

SUMMARY OF THE INVENTION

An object of the present invention is to provide an improved optical non-resonating laser diode amplifier, particularly in that the overall gain difference between the two inherent polarization states is appreciably reduced. To this end, there is provided an amplifier in which the active material strip has end portions whose thickness is less than that of the central portion and is selected to give a low value to the difference between the wavelengths corresponding to the reflectivity minima for the two inherent polarization states, the end portions being connected to the central portion by sections having a progressively increasing thickness.

In practice, good results are generally obtained by giving to the ratio between the thickness of the end portions and the thickness of the central portion a value between 1/5 and 1/10 and by giving to the transition sections a slope in the one percent range.

So that the presence of the end portions has no appreciable influence on the difference between the internal gains of the laser diode as a whole for the two modes, they will generally be given a length less than 10% of the total length L of the active portion. These end portions may have a length less than 50 microns for a length of the central portion between 500 and 700 microns.

The invention will be better understood from the following description of a particular embodiment, given only by way of example.

SHORT DESCRIPTION OF THE DRAWINGS

DETAILED DESCRIPTION OF A PREFERRED EMBODIMENT

Before describing a possible construction of an optical laser diode amplifier according to the invention, it may be useful to outline principles on which the invention is based. As mentioned above, a conventional laser diode is formed of a strip of active material of constant thickness d, of width l and length L, surrounded by an optical sheath of a material having a refraction index lower than that of the strip. The guide has a TE mode polarization state (electric field parallel to the junction plane, i.e. to the plane of the length L and of the width l) and a TM mode state (where the magnetic field is parallel to the junction plane).

Figure 1:
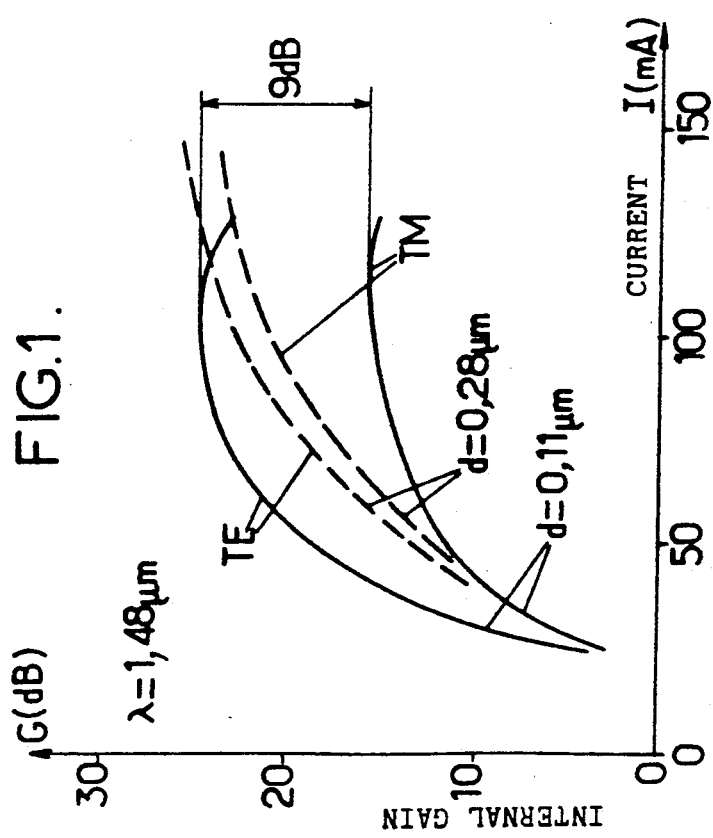
FIG. 1 is a diagram showing the variation of the internal gain vs. the injection current I, for the two inherent polarization states TE and TM in the case of a thin active layer (continuous line curves) and a thick active layer (broken line curves)

The difference of internal gain G between the inherent polarization states is apparent from FIG. 1, which shows the variation of the gain as a function of the injection current I : an increase in the thickness d of the active layer, from 0.11 μm to 0.28 μm, noticeably reduces the sensivity of the internal gain G to the polarization.

Figure 2:
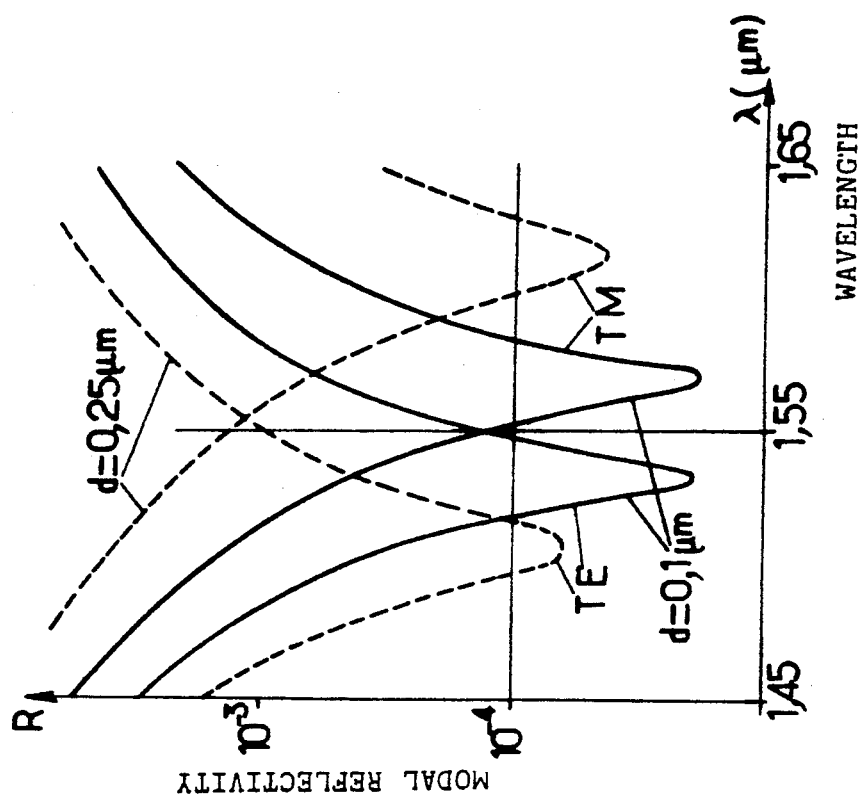
FIG. 2 is a diagram showing the general shape of the variation of the residual modal reflectivity R as a function of the wavelength, for the two inherent polarization states, for a thin active layer (continuous line curves) and a thick active layer (broken line curves)

The curves of FIG. 2 show that, on the other hand, the ranges of the optical spectrum for which the anti-reflection coatings have a low reflectivity are closer if the active layer is thinner. It can in particular be seen that the modal reflectivity R may be maintained at a value of $10^{-4}$ for a 1.55 μm wavelength for both modes, if the thin guide has a thickness of 0.1 μm. With such a low value the above condition (1) may be fulfilled without difficulty for both modes, in the case of an internal gain G of 30 dB, representative of the current values, for a relatively wide spectral band. On the other hand, there is no overlap of the low reflectivity zones in the case of a large thickness d=0.25 μm.

Figure 3:
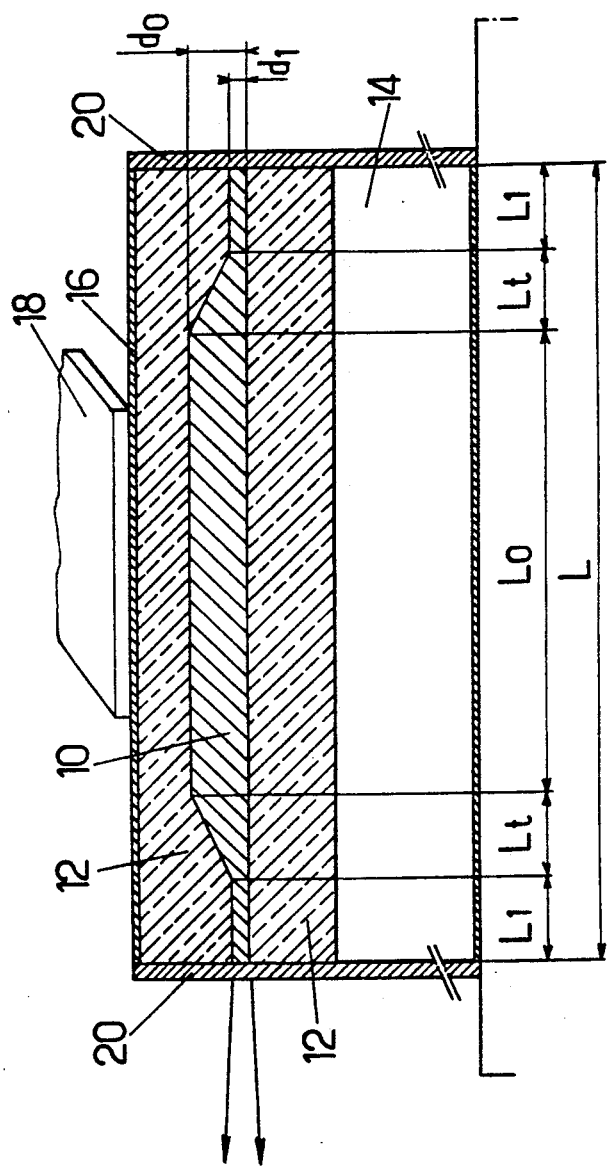
FIG. 3 is a diagrammatic view in longitudinal cross-section showing the construction of a laser diode which can be used in an optical amplifier, the scale not being respected for clarity.

The optical amplifier whose general construction is shown in FIG. 3 benefits from the favorable characteristics of a "thick" guide insofar as regards the internal gain and a "thin" guide as regards the modal reflectivity, without introducing associated drawbacks, provided that the end portions of small thickness are quite short as compared to the central portion.

The laser diode shown in FIG. 3 conventionally comprises a strip of optically active material active layer 10 of length L contained between two confinement layers 12 which form a confinement sheath. One of the layers is carried by the substrate 14 and the other of which is coated with a metal layer 16 connected to an injection current feedline 18. The end faces of the active layer, which form an amplifying guide, carry thin anti-reflection layers 20, formed using any one of the well known procedures.

However, while a conventional laser diode has a constant thickness over its whole length L, the active layer 10 of the laser diode of FIG. 3 has several portions of different thicknesses.

The central portion whose length Lo represents the major part (more than 80% in a general rule) of the length L, has a thickness $d_0$ which is a large fraction of the operating wavelength. This portion will practically always have a thickness greater than one tenth of the wavelength. In this central portion the TE and TM modes are very confined and the gains for the TE and TM polarization modes are not very different. For a length of 500 $\mu$m, the gain will generally be between 25 and 30 dB and the gain differential between the two modes will be only 2 to 3 dB.

The end portions, of length Ll, have a thickness $d_1$ very much less than $d_0$ and less than one tenth of the operating wavelength. In these portions, the polarization mode is consequently very wide and may be substantially TEM : the anti-reflection coatings may consequently be rendered little sensitive to polarization. The end portions must be short, so that their presence has only a small influence on the internal gain and so on the gain differential between the two modes.

Transition sections of length Lt and of progressively increasing cross-section connect the central portion to the end portions which may be reduced to the end faces. The end sections provide adiabatic matching between the modes of the end and central portions. Provided that the variation in cross-section is slow, the losses due to radiation or reflection may be very small.

As illustrated on FIG. 3, the strip is deposited on a first flat confinement layer and the variation of thickness is achieved with a substantial constant slope, of about 1%, to the transition sections. Such a variation may be obtained by using conventional molecular beam epitaxy techniques and a mask situated above the strip to be formed.

The end portions of small thickness provide an additional advantage : the considerable amount of deconfinement of the TEM mode in such portions improves the degree of coupling with input and output optical fibers of the amplifier.

Good results have in particular been obtained by adopting dimensions in the following ranges, for an amplifier having a central wavelength of 1.5 $\mu$m:

|  | Thickness | Width |
| --- | --- | --- |
| Central portion | $0{,}35 \leq d_0 \leq 0{,}5\ \mu m$ | $500 \leq L0 \leq 700\ \mu m$ |
| End portions | $0{,}05 \leq d_1 \leq 0{,}08\ \mu m$ | $0 \leq L1 \leq 30\ \mu m$ |
| Transition sections |  | $30 \leq Lt \leq 50\ \mu m$ |

In a modified embodiment (not shown) a thin layer, typically of about 0.1 $\mu$m for a wavelength of 1.5 $\mu$m, is interposed between the strip 10 and the sheath. The layer, of a material which is transparent to the operating wavelength and has an optical index smaller than that of the confinement layers 12, which form a confinement sheath, further reduces, by about 0.5 dB, the gain differential between the TE and TM modes.

We claim:

1. Non-resonating laser diode optical amplifier, comprising:
   a strip of optically active material forming an amplifying optical guide;
   confinement layers covering said strip on both sides thereof for forming a confinement sheath;
   anti-reflection layers on end faces of said strip;
   a substrate supporting said strip and confinement sheath; and
   electrode means for feeding current to said strip;
   wherein said strip has end portions whose thickness is about 1/100 of the wavelength of the laser diode and a central portion whose thickness is about 1/10 of said wavelength, whereby the difference between the wavelength corresponding to the reflectivity minima for the two inherent polarization states of said laser diode is low as compared with the difference of a laser diode optical amplifier which would have the same thickness as said end portions throughout its length,
   and wherein said end portions are connected to the central portion by transition sections having a progressively increasing thickness,
   the ratio being the thickness of said end portions and the thickness of said central portion having a value between 1/5 and 1/10.

2. Amplifier according to claim 1,
   wherein one surface of said strips is planar while the opposed surface thereof has a slope of about 1% in said transition sections.

3. Amplifier according to claim 1,
   wherein said end portions have a length lower than 50 $\mu$m while the central portion has a length comprised between 500 and 1,000 $\mu$m.

4. Amplifier according to claim 1,
   wherein the end portions have a length lower than 10% of the overall length of the strip.

5. Non-resonating laser diode optical amplifier, comprising:
   a strip of optically active material forming an amplifying optical guide and of such a nature as to lase at a wavelength about 1.5 $\mu$m;
   confinement layers covering said strip on both sides thereof for forming a confinement sheath;
   anti-reflection layers on end faces of said strip;
   a substrate supporting said strip and confinement sheath; and
   electrode means for feeding current to said strip;
   wherein said strip has end portions whose thickness is of from 0.05 to 0.08 $\mu$m and a central portion whose thickness is of from 0.35 to 0.5 $\mu$m, whereby the difference between the wavelengths corresponding to the reflectivity minima for the two inherent polarization states of said laser diode is low as compared with the difference of a laser diode optical amplifier which would have the same thickness as said end portions throughout its length, and wherein said end portions are connected to the central portion by transition sections having a progressive increasing thickness.

6. Amplifier according to claim 5, wherein a layer, thin as compared to the wavelength, is interposed between said strip and said sheath, said layer being of a material which is transparent to the wavelength of said laser diode.

7. Amplifier according to claim 5, wherein said anti-reflection layers have a modal reflectivity of about 10-4.

* * * * *